United States Patent
Yung-Sung et al.

Patent Number: 5,652,172
Date of Patent: Jul. 29, 1997

[54] METHOD FOR CONTROLLING THE ETCH PROFILE OF AN APERTURE FORMED THROUGH A MULTI-LAYER INSULATOR LAYER

[75] Inventors: Peng Yung-Sung, Miao; An Min Chiang, Hsinchu; Shau-Tsung Yu, Taipei; Min-Yi Lin, Chia, all of Taiwan

[73] Assignee: Taiwan Semiconductor Manufacturing Company Ltd., Hsin-Chu, Taiwan

[21] Appl. No.: 639,679

[22] Filed: Apr. 29, 1996

[51] Int. Cl.$^6$ ............... H01L 21/70; H01L 27/00
[52] U.S. Cl. ............... 437/60; 437/52; 437/919; 437/947; 437/228 SE; 437/228 PE
[58] Field of Search ............... 156/644.1; 437/52, 437/60, 919, 228 SE, 228 PE, 947

[56] References Cited

U.S. PATENT DOCUMENTS

| | | | |
|---|---|---|---|
| 4,814,041 | 3/1989 | Auda | 156/644.1 |
| 5,225,376 | 7/1993 | Feaver et al. | 437/228 |
| 5,322,809 | 6/1994 | Moslehi | 437/41 |
| 5,342,798 | 8/1994 | Huang | 437/41 |
| 5,354,716 | 10/1994 | Pors et al. | 437/52 |
| 5,464,782 | 11/1995 | Koh | 437/41 |

Primary Examiner—Jey Tsai
Attorney, Agent, or Firm—George O. Saile; Alek D. Szecsy

[57] ABSTRACT

A method for forming an aperture with a uniform void-free sidewall etch profile through a multi-layer insulator layer. There is formed upon a semiconductor substrate a multi-layer insulator layer which has a minimum of a first insulator layer and a second insulator layer. The second insulator layer is formed upon the first insulator layer. There is then etched through a first etch method a first aperture completely through the second insulator layer. The first etch method has: (1) a first perpendicular etch selectivity ratio for the second insulator layer with respect to the first insulator layer of at least about 4:1; and (2) a lateral:perpendicular etch selectivity ratio for the second insulator layer of from about 0.5:1 to about 1:1. The first aperture is then etched through a second etch method to form a second aperture completely through the second insulator layer and the first insulator layer. The second etch method has: (1) a second perpendicular etch selectivity ratio for the second insulator layer with respect to the first insulator layer of no greater than about 2:1; and (2) a lateral etch selectivity ratio of the second insulator layer with respect to the first insulator layer of from about 0.5:1 to about 1:1. The second aperture has a uniform void-free sidewall etch profile.

22 Claims, 4 Drawing Sheets

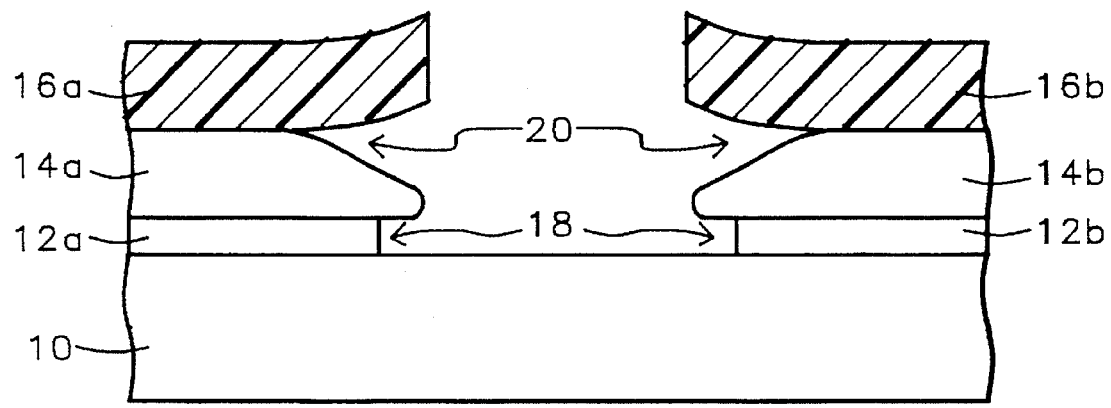
FIG. 1 - Prior Art
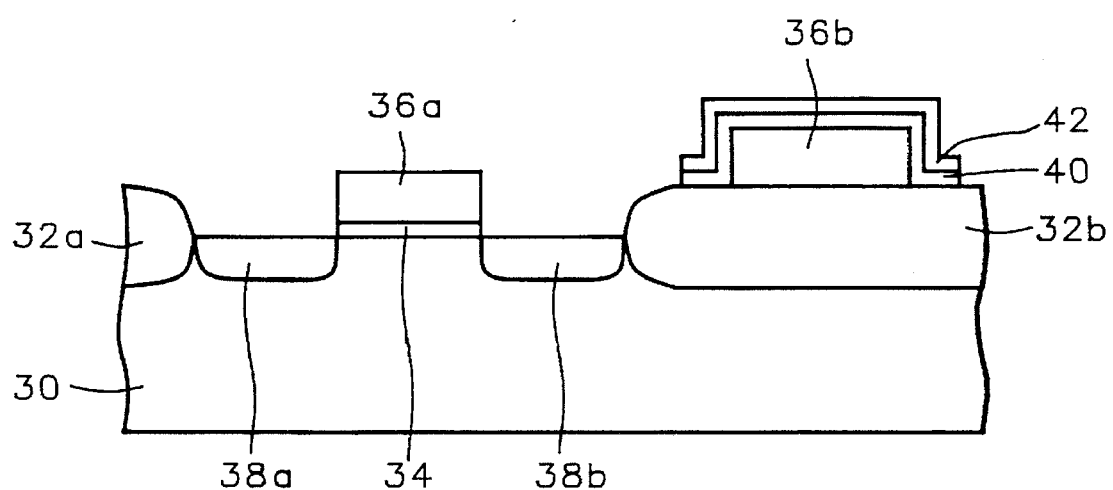
FIG. 2

METHOD FOR CONTROLLING THE ETCH PROFILE OF AN APERTURE FORMED THROUGH A MULTI-LAYER INSULATOR LAYER

BACKGROUND OF THE INVENTION

1. Field of the Invention

The present invention relates generally to insulator layers within integrated circuits. More particularly, the present invention relates to methods for controlling the etch profiles of apertures formed through multi-layer insulator layers within integrated circuits.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by insulator layers.

In the process of connecting and interconnecting patterned conductor layers and electrical circuit elements which are separated by blanket insulator layers within integrated circuits, it is common in the art to employ photo lithographic and etching methods in forming apertures through those blanket insulator layers. When the blanket insulator layers are single layer blanket insulator layers, the apertures formed through those single layer blanket insulator layers may typically be etched through a single etch method to form apertures with uniform void-free sidewall etch profiles.

It is quite common, however, within advanced integrated circuits that blanket insulator layers are formed from blanket multi-layer insulator layers rather than blanket single layer insulator layers. Thus, it is also quite common within advanced integrated circuits that blanket multi-layer insulator layers when etched through a single etch method will typically yield through those blanket multi-layer insulator layers apertures having irregular sidewall etch profiles which exhibit voids. A schematic cross-sectional diagram illustrating the irregular sidewall etch profile of an aperture etched through a blanket two-layer multi-layer insulator layer employing a single etch method is shown in FIG. 1.

Shown within FIG. 1 is a substrate layer 10 having an aperture formed through a blanket two-layer multi-layer insulator layer formed upon the substrate layer 10. The aperture is defined by a pair of patterned first insulator layers 12a and 12b which reside beneath a pair of patterned second insulator layers 14a and 14b. A pair of patterned photo resist layers 16a and 16b is employed as a mask in sequentially patterning the pair of patterned second insulator layers 14a and 14b from a corresponding blanket second insulator layer and the pair of patterned first insulator layers 12a and 12b from a corresponding blanket first insulator layer.

As is shown in FIG. 1, the patterned first insulator layers 12a and 12b are undercut beneath the corresponding patterned second insulator layers 14a and 14b, thus yielding a pair of first voids 18. As is also shown in FIG. 1, the pair of patterned photo resist layers 16a and 16b is partially delaminated from the pair of patterned second insulator layers 14a and 14b, thus yielding a pair of second voids 20 through which the exposed upper surfaces of the pair of patterned second insulator layers 14a and 14b are typically undesirably over-etched. The aperture of irregular sidewall etch profile which exhibits voids, as illustrated in FIG. 1, is typically obtained when employing a single isotropic etchant in forming the aperture through a blanket two-layer multi-layer insulator layer. When obtaining the irregular sidewall contour as illustrated in FIG. 1, the single isotropic etchant will typically have a substantially higher perpendicular and lateral etch rate for the blanket first insulator layer in comparison with the blanket second insulator layer, as well as a substantial interfacial permeability for a photo resist/insulator layer interface. Within advanced integrated circuits within which the blanket first insulator layer and the blanket second insulator layer are both formed of silicon oxide with substantially different chemical and/or physical properties, the single isotropic etchant which fulfills the two foregoing characteristics is typically, although not exclusively, a Buffered Oxide Etchant (BOE) wet chemical etchant.

Given that voids formed within apertures through blanket multi-layer insulator layers often provide functionality and reliability problems within integrated circuits within which are formed those blanket multi-layer insulator layers, it is thus an object of the present invention to provide a method for forming through a multi-layer insulator layer within an integrated circuit an aperture with a uniform void-free sidewall etch profile.

Methods and materials through which integrated circuit structures within integrated circuits may be uniformly and selectively formed are known in the art. For example, Moslehi, in U.S. Pat. No. 5,322,809 discloses a self-aligned method for uniformly and selectively forming a silicide layer of greater thickness upon a gate electrode of a Metal Oxide Semiconductor Field Effect Transistor (MOSFET) than upon a pair of source/drain electrode regions of the Metal Oxide Semiconductor Field Effect Transistor (MOSFET). In addition, Huang, in U.S. Pat. No. 5,342,798 discloses a differential oxidation method for uniformly and selectively forming silicide layers upon some source/drain electrode regions within a series of Metal Oxide Semiconductor Field Effect Transistors (MOSFETs) but not upon other source/drain electrode regions within the series of Metal Oxide Semiconductor Field Effect Transistors (MOSFETs). Finally, Koh, in U.S. Pat. No. 5,464,782 discloses a self-aligned method for uniformly and selectively forming silicide layers upon the gate electrode and source/drain electrode regions of a Metal Oxide Semiconductor Field Effect Transistor (MOSFET) in a fashion such that there is less susceptibility to bridging between the gate electrode and the source/drain electrode regions of the Metal Oxide Semiconductor Field Effect Transistor (MOSFET).

Desirable in the art are methods for forming through multi-layer insulator layers within integrated circuits apertures with uniform void-free sidewall etch profiles. Particularly desirable in the art are methods through which apertures with uniform void-free sidewall etch profiles may be formed through multi-layer insulator layers formed of silicon oxide within integrated circuits.

SUMMARY OF THE INVENTION

A first object of the present invention is to provide a method for forming through a multi-layer insulator layer within an integrated circuit an aperture with a uniform void-free sidewall etch profile.

A second object of the present invention is to provide a method in accord with the first object of the present invention, wherein the multi-layer insulator layer is a multi-layer insulator layer formed of silicon oxide.

A third object of the present invention is to provide a method in accord with the first object of the present invention or the second object of the present invention, which method is readily manufacturable.

In accord with the objects of the present invention, there is provided a method for forming through a multi-layer insulator layer within an integrated circuit an aperture with a uniform void-free sidewall etch profile. To practice the method of the present invention, there is first formed upon a semiconductor substrate a multi-layer insulator layer. The multi-layer insulator layer has a minimum of a first insulator layer and a second insulator layer, where the second insulator layer of the multi-layer insulator layer is formed upon the first insulator layer of the multi-layer insulator layer. There is then etched through a first etch method a first aperture completely through the second insulator layer. The first etch method has: (1) a first perpendicular etch selectivity ratio for the second insulator layer with respect to the first insulator layer of at least about 4:1; and (2) a lateral:perpendicular etch selectivity ratio of the second insulator layer of from about 0.5:1 to about 1:1. The first aperture is etched through a second etch method to form a second aperture completely through the second insulator layer and the first insulator layer. The second etch method has: (1) a second perpendicular etch selectivity ratio for the second insulator layer with respect to the first insulator layer of no greater than about 2:1; and (2) a lateral etch selectivity ratio of the second insulator layer with respect to the first insulator layer of from about 0.5:1 to about 1:1.

The present invention provides a method for forming through a multi-layer insulator layer within an integrated circuit an aperture with a uniform void-free sidewall etch profile. The method of the present invention provides the aperture with a uniform void-free sidewall etch profile through use of a first etch method followed by a second etch method. The first etch method has a specified first perpendicular etch selectivity ratio and a specified lateral:perpendicular etch selectivity ratio with respect to a second insulator layer and a first insulator layer within the multi-layer insulator layer. The second etch method has a specified second perpendicular etch selectivity ratio and a specified lateral etch selectivity ratio with respect to the second insulator layer and the first insulator layer within the multi-layer insulator layer. Through employing the first etch method and the second etch method with the specified etch selectivity ratios, an aperture with a uniform void-free sidewall etch profile may be formed through the second insulator layer and the first insulator layer within the multi-layer insulator layer.

The present invention may be employed in forming an aperture with a uniform void-free sidewall etch profile through a multi-layer silicon oxide insulator layer. The method of the present invention does not discriminate between the materials from which are formed the individual insulator layers within the multi-layer insulator layer. Provided that the foregoing etch selectivity ratios are within the specified ranges, an aperture with a uniform void-free sidewall etch profile may be formed through a multi-layer silicon oxide insulator layer.

The method of the present invention is readily manufacturable. Etch methods through which apertures within insulator layers within integrated circuits may be etched are in general known in the art of integrated circuit manufacture. The present invention provides that a first etch method and a second etch method are chosen such that several etch rate ratios of the first etch method and the second etch method are within specified ranges for a second insulator layer and a first insulator layer within a multi-layer insulator layer. Given that the usefulness of the present invention lies at least in part in choosing a first etch method and a second etch method with etch rates ratios that fall within the specified ranges, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 1 shows a schematic cross-sectional diagram illustrating an aperture of irregular sidewall etch profile formed through a two-layer multi-layer insulator employing an etch method of the prior art.

FIG. 2 to FIG. 7 show a series of schematic cross-sectional diagrams illustrating the results of progressive process steps in forming within an integrated circuit an aperture through a silicon oxide two-layer multi-layer insulator layer in accord with the preferred embodiment of the method of the present invention.

DESCRIPTION OF THE PREFERRED EMBODIMENT

Figure 3:
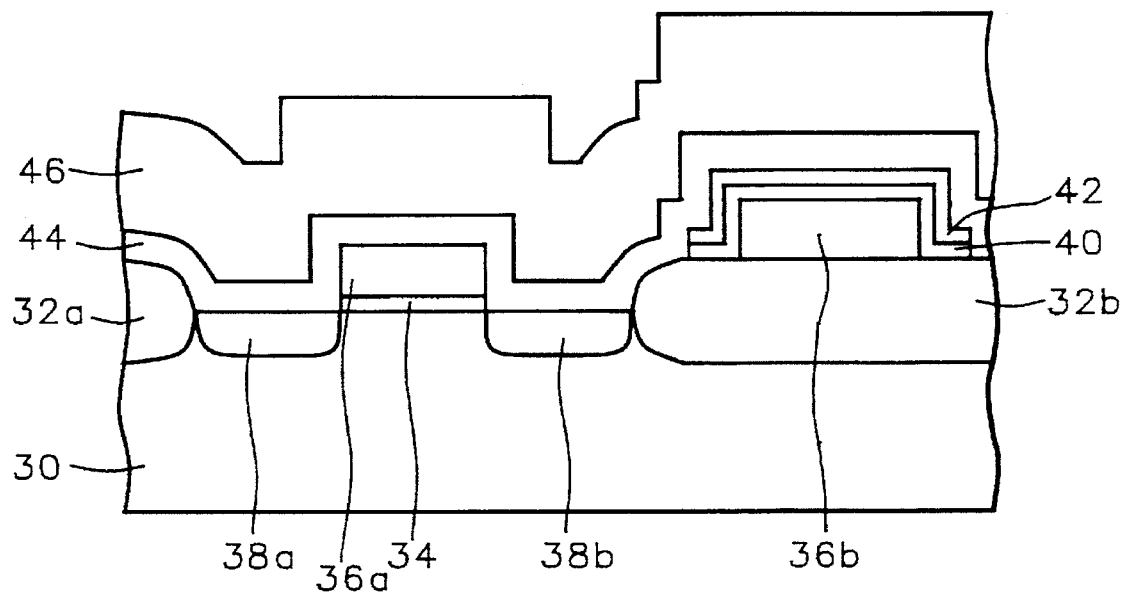

The present invention provides a method for forming within a multi-layer insulator layer within an integrated circuit an aperture with a uniform void-free sidewall etch profile. The multi-layer insulator layer has a minimum of a first insulator layer and a second insulator layer, where the second insulator layer is formed upon the first insulator layer. The method of the present invention provides the aperture with a uniform void-free sidewall etch profile through the multi-layer insulator layer by employing: (1) a first etch method in etching a first aperture through the second insulator layer; and (2) a second etch method in etching the first aperture completely through the second insulator layer and the first insulator layer. The first etch method has: (1) a first perpendicular etch selectivity ratio for the second insulator layer with respect to the first insulator layer of at least about 4:1; and (2) a lateral:perpendicular etch selectivity ratio for the second insulator layer of from about 0.5:1 to about 1:1. The second etch method has: (1) a second perpendicular etch selectivity ratio for the second insulator layer with respect to the first insulator layer of no greater than about 2:1; and (2) a lateral etch selectivity ratio for the second insulator layer with respect to the first insulator layer of from about 0.5:1 to about 1:1.

The method of the present invention may be employed in forming apertures having uniform void-free sidewall etch profiles through multi-layer insulator layers within various types of integrated circuits. The method of the present invention may be employed in forming apertures with uniform void-free sidewall etch profiles through multi-layer insulator layers within integrated circuits including but not limited to Dynamic Random Access Memory (DRAM) integrated circuits, Static Random Access Memory (SRAM) integrated circuits, Application Specific Integrated Circuits (ASICs), integrated circuits having within their fabrications Field Effect Transistors (FETs), integrated circuits having within their fabrications bipolar transistors and integrated circuits having within their fabrications Bipolar Complementary Metal Oxide Semiconductor BiCMOS) transistors. The method of the present invention has broad applicability in forming through multi-layer insulator layers within integrated circuits apertures with uniform void-free sidewall etch profiles.

Referring now to FIG. 2 to FIG. 7, there is shown a series of schematic cross-sectional diagrams illustrating the results of progressive process steps in forming through a silicon oxide multi-layer insulator layer within an integrated circuit an aperture with a uniform void-free sidewall etch profile through the preferred embodiment of the method of the present invention. Shown in FIG. 2 is a schematic cross-sectional diagram of the integrated circuit at the early stages of its formation.

Shown in FIG. 2 is a semiconductor substrate 30 having formed within and upon its surface isolation regions 32a and 32b which define the active region of the semiconductor substrate 30. Although the method of the present invention may be practiced upon semiconductor substrates having either dopant polarity, any dopant concentration and any crystallographic orientation, the semiconductor substrate 30 upon which is practiced the preferred embodiment of the method of the present invention is typically and preferably a silicon semiconductor substrate 30 having a N- or a P-doping concentration.

Methods and materials through which isolation regions may be formed within and/or upon semiconductor substrates are known in the art. Isolation regions may be formed within and/or upon semiconductor substrates through methods including but not limited to thermal oxidation methods whereby portions of a semiconductor substrate exposed through a suitable mask are oxidized to form isolation regions within and/or upon the semiconductor substrate and deposition methods whereby a suitable blanket insulator layer is deposited upon the surface of a semiconductor substrate and patterned to form isolation regions upon the surface of the semiconductor substrate. For the preferred embodiment of the method of the present invention, the isolation regions 32a and 32b are preferably formed through a thermal oxidation method whereby portions of the semiconductor substrate 30 exposed through a suitable mask are oxidized to form isolation regions 32a and 32b of silicon oxide within and upon the semiconductor substrate 30.

Also shown in FIG. 2 is a patterned gate oxide layer 34 upon which is formed a gate electrode 36a, and a pair of source/drain electrodes 38a and 38b formed into the active region of the semiconductor substrate 30 at areas not occupied by the patterned gate oxide layer 34 and the gate electrode 36a. The patterned gate oxide layer 34, the gate electrode 36a and the pair of source/drain electrodes 38a and 38b are components of a Metal Oxide Semiconductor Field Effect Transistor (MOSFET). Methods and materials through which Metal Oxide Semiconductor Field Effect Transistor (MOSFET) components such as the patterned gate oxide layer 34, the gate electrode 36a and the source/drain electrodes 38a and 38b may in general be formed within or upon a semiconductor substrate such as the semiconductor substrate 30 are known in the art.

For example, patterned gate oxide layers may be formed upon semiconductor substrates through patterning through methods as are conventional in the art of blanket gate oxide layers formed upon those semiconductor substrates. The blanket gate oxide layers may be formed through methods including but not limited to thermal oxidation methods whereby the active region of a semiconductor substrate is thermally oxidized to form a blanket gate oxide layer upon the active region of the semiconductor substrate, and blanket gate oxide layer deposition methods whereby a blanket gate oxide layer is deposited upon the active region of the semiconductor substrate. Analogously with patterned gate oxide layers, gate electrodes are also typically patterned through methods as are conventional in the art from blanket layers, although the blanket layers are formed of gate electrode materials. Blanket layers of gate electrode materials may be formed of conducive materials including but not limited to metals, metal alloys, highly doped polysilicon and polycides (highly doped polysilicon/metal silicide stacks). Finally source/drain electrodes within Metal Oxide Semiconductor Field Effect Transistors (MOSFETs) are typically formed through implanting dopant ion species of suitable dose and polarity into an active region of a semiconductor substrate. Arsenic dopant species, boron dopant species and phosphorus dopant species are common in the art of forming source/drain electrodes within Metal Oxide Semiconductor Field Effect Transistors (MOSFETs).

For the preferred embodiment of the method of the present invention, the patterned gate oxide layer 34 is preferably formed through patterning through methods as are conventional in the art of a blanket gate oxide layer formed through thermal oxidation of the active region of the semiconductor substrate 30 at a temperature of from about 800 to about 1000 degrees centigrade to form a blanket gate oxide layer of thickness about 100 to about 300 angstroms. In addition, for the preferred embodiment of the method of the present invention, the gate electrode 36a is preferably formed through patterning through methods as are conventional in the art of a blanket layer of gate electrode material formed upon the blanket gate oxide layer. Preferably, the blanket layer of gate electrode material is formed of highly doped polysilicon formed upon the blanket gate oxide layer through a Chemical Vapor Deposition (CVD) method employing silane as a silicon source material, along with suitable dopants. Preferably, the blanket layer of gate electrode material has a thickness of from about 2500 to about 5000 angstroms and a sheet resistance of no greater than about 10 ohms per square. Subsequent to patterning the gate electrode 36a from the blanket layer of gate electrode material, the gate electrode 36a may be employed as a mask when patterning the patterned gate oxide layer 34 from the blanket gate oxide layer. Finally, for the preferred embodiment of the method of the present invention, the source/drain electrodes 38a and 38b are preferably formed through ion implanting into the active region of the semiconductor substrate 30, while employing the gate electrode 36a and the patterned gate oxide layer 34 as a mask, a suitable dopant ion species at an ion implantation dose of from about 1E12 to about 5E15 ions per square centimeter and an ion implantation energy of from about 50 to about 100 keV.

Also shown in FIG. 2 is the presence of a first capacitor plate 36b upon which is formed a patterned first capacitor dielectric layer 40. In turn, there is formed upon the patterned first capacitor dielectric layer 40 a patterned second capacitor dielectric layer 42. The first capacitor plate 36b, the patterned first capacitor dielectric layer 40 and the patterned second capacitor dielectric layer 42 are formed upon the isolation region 32a of the semiconductor substrate 30, as is common in the art of analog integrated circuit manufacture.

Methods and materials through which capacitor plates and patterned capacitor dielectric layers may be formed within integrated circuits are known within the art of integrated circuit manufacture. Capacitor plates may be formed through patterning through methods as are conventional in the art of blanket layers of capacitor plate materials including but not limited to metals, metal alloys and highly doped polysilicon. Patterned capacitor dielectric layers may analogously be formed through patterning through methods as are conventional in the art of blanket capacitor dielectric layers formed of dielectric materials including but not limited to silicon oxide dielectric materials, silicon nitride dielectric materials and silicon oxynitride dielectric materials. Both capacitor plates and patterned capacitor dielectric layers may be formed through methods as are conventional in the art, including but not limited to Chemical Vapor Deposition (CVD) methods, Plasma Enhanced Chemical Vapor Deposition (PECVD) methods, Physical Vapor Deposition (PVD) sputtering methods and thermally assisted evaporation methods.

For the preferred embodiment of the method of the present invention, the first capacitor plate 36b is preferably formed simultaneously with, and through patterning of, the same blanket layer of gate electrode material from which is formed the gate electrode 36a. Thus, the first capacitor plate 36b is also preferably formed through patterning through methods as are conventional in the art of a blanket layer of highly doped polysilicon formed to a thickness of from about 2500 to about 5000 angstroms and a sheet resistance of no greater than about 10 ohms per square. For the preferred embodiment of the method of the present invention, the patterned first capacitor dielectric layer 40 is preferably formed upon the first capacitor plate 36b through patterning through methods as are conventional in the art of a blanket first capacitor dielectric layer formed of a silicon oxide dielectric material formed upon the first capacitor plate 36b through a thermal oxidation method at a thickness of from about 50 to about 100 angstroms. Finally, for the preferred embodiment of the method of the present invention, the patterned second capacitor dielectric layer 42 is preferably formed through patterning through methods as are conventional in the art of a blanket second capacitor dielectric layer formed of a silicon nitride deposited upon blanket first capacitor dielectric layer. Preferably, the blanket second capacitor dielectric layer of a silicon nitride is formed to a thickness of from about 100 to about 500 angstroms.

Referring now to FIG. 3 there is shown a schematic cross-sectional diagram illustrating the results of further processing of the integrated circuit whose schematic cross-sectional diagram is illustrated in FIG. 2. Shown in FIG. 3 is the presence of a blanket conformal Pre-Metal Dielectric (PMD) layer 44 formed upon the integrated circuit whose schematic cross-sectional diagram is illustrated in FIG. 2. Also shown in FIG. 3 is the presence of a blanket reflowable Pre-Metal Dielectric (PMD) layer 46 formed upon the surface of the blanket conformal Pre-Metal Dielectric (PMD) layer 44.

Methods and materials through which blanket dielectric layers such as the blanket conformal Pre-Metal Dielectric (PMD) layer 44 and the blanket reflowable Pre-Metal Dielectric (PMD) layer 46 may be formed within integrated circuits are known in the art of integrated circuit manufacture. Blanket dielectric layers may be formed within integrated circuits through methods including but not limited to Chemical Vapor Deposition (CVD) methods, Plasma Enhanced Chemical Vapor Deposition (PECVD) methods and Physical Vapor Deposition (PVD) sputtering methods through which may be formed blanket dielectric layers of dielectric materials including but not limited to silicon oxide dielectric materials, silicon nitride dielectric materials and silicon oxynitride dielectric materials.

For the preferred embodiment of the method of the present invention, the blanket conformal Pre-Metal Dielectric (PMD) layer 44 is preferably formed of a silicon oxide dielectric material deposited through a Atmospheric Pressure Chemical Vapor Deposition (APCVD) method, as is commonly employed in the art. Preferably, the blanket conformal Pre-Metal Dielectric (PMD) layer 44 is from about 500 to about 1500 angstroms thick. For the preferred embodiment of the method of the present invention, the blanket reflowable Pre-Metal Dielectric (PMD) layer 46 is preferably formed of a silicate glass silicon oxide dielectric material chosen from the group of silicate glass silicon oxide dielectric materials consisting of Boro Silicate Glasses (BSGs), Phospho Silicate Glasses (PSGs) and Boro Phospho Silicate Glasses (BPSGs). The blanket reflowable Pre-Metal Dielectric (PMD) layer 46 is preferably formed of a silicate glass in order to allow for ease in reflowing the blanket reflowable Pre-Metal Dielectric (PMD) layer 46. Preferably, the blanket reflowable Pre-Metal Dielectric (PMD) layer 46 is formed to a thickness of from about 4000 to about 6000 angstroms.

Figure 4:
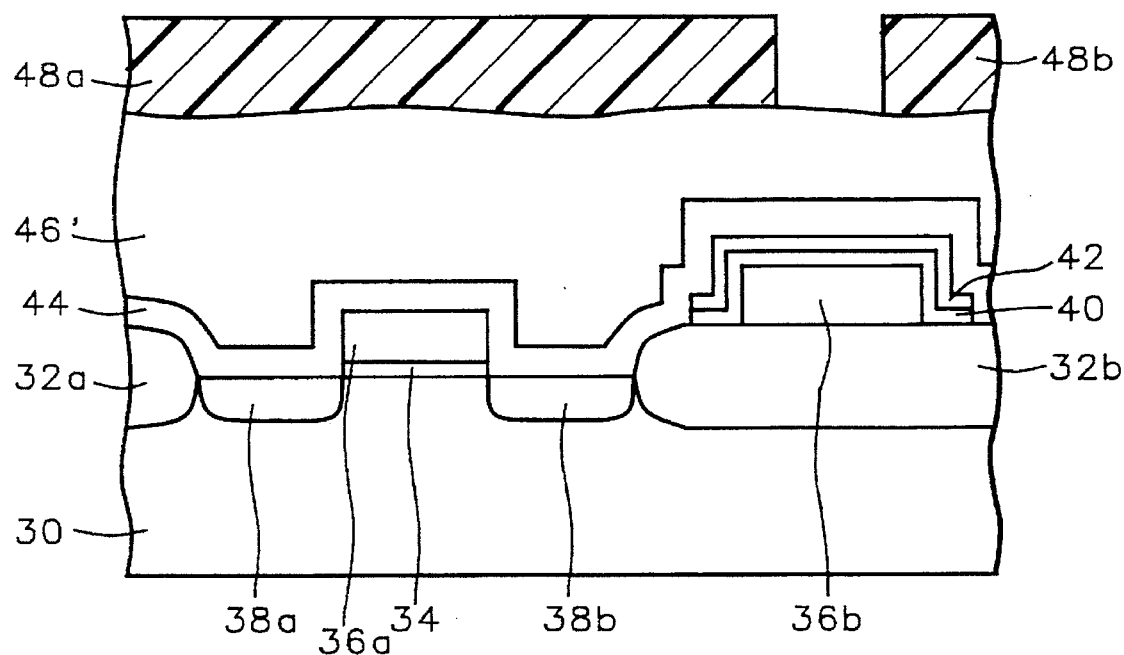

Referring now to FIG. 4, there is shown a schematic cross-sectional diagram illustrating the results of further processing of the integrated circuit whose schematic cross-sectional diagram is illustrated in FIG. 3. Shown in FIG. 4 is a blanket reflowed Pre-Metal Dielectric (PMD) layer 46' which is formed through reflowing of the blanket reflowable Pre-Metal Dielectric (PMD) layer 46 as shown in FIG. 3. Methods through which reflowable dielectric layers within integrated circuits may be reflowed to form reflowed dielectric layers within those integrated circuits are known in the art of integrated circuit manufacture. Reflowable dielectric layers within integrated circuits may be reflowed to form reflowed dielectric layers within integrated circuits through methods including but not limited to conventional thermal annealing methods, Rapid Thermal Processing (RTP) thermal annealing methods and light illumination annealing methods where surfaces of semiconductor substrates are exposed to intense light of appropriate wavelength to be efficiently absorbed and dissipated as heat. For the preferred embodiment of the method of the present invention, the blanket reflowable Pre-Metal Dielectric (PMD) layer 46 is preferably reflowed to form the blanket reflowed Pre-Metal Dielectric (PMD) layer 46' through a conventional thermal annealing method at a temperature of from about 850 to about 950 degrees centigrade for a time period of from about 25 to about 60 minutes.

Also shown in FIG. 4 is the presence of a pair of patterned photoresist layers 48a and 48b formed upon the blanket reflowed Pre-Metal Dielectric (PMD) layer 46'. The pair of patterned photoresist layers 48a and 48b is employed as a mask in forming an aperture sequentially etched through the blanket reflowed Pre-Metal Dielectric (PMD) layer 46' and the blanket conformal Pre-Metal Dielectric (PMD) layer 44. Together, the blanket reflowed Pre-Metal Dielectric (PMD) 46' and the blanket conformal Pre-Metal Dielectric (PMD) layer 44 form a two-layer multi-layer silicon oxide insulator layer through which the aperture is formed through the preferred embodiment of the method of the present invention. The photoresist material from which is formed the pair of patterned photoresist layers 48a and 48b is not critical to the present invention provided that the pair of patterned photoresist layers 48a and 48b is formed from a photoresist material which has limited susceptibility to degradation from exposure to the multiple etch methods to which the pair of patterned photoresist layers 48a and 48b will subsequently be exposed. Preferably, each individual patterned photoresist layer within the pair of patterned photoresist layers 48a and 48b is from about 8000 to about 15000 angstroms thick.

Figure 5:
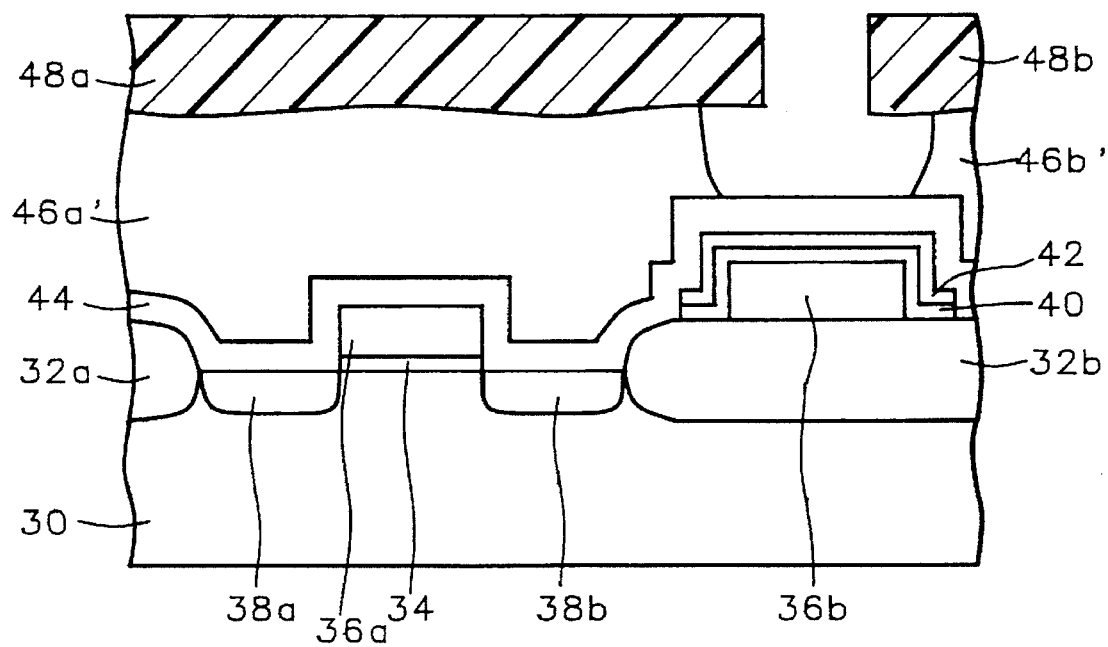

Referring now to FIG. 5, there is shown a schematic cross-sectional diagram illustrating the results of further processing of the integrated circuit whose schematic cross-sectional diagram is illustrated in FIG. 4. Shown in FIG. 5 is the results of patterning the blanket reflowed Pre-Metal Dielectric (PMD) layer 46' to form a first aperture which separates the patterned reflowed Pre-Metal Dielectric (PMD) layers 46a' and 46b'. The blanket reflowed Pre-Metal Dielectric (PMD)) layer 46' is patterned to form the patterned reflowed Pre-Metal Dielectric (PMD) layers 46a' and 46b' through a first etch method. For the preferred embodiment of the method of the present invention, the first etch method preferably has a first perpendicular etch selectivity ratio for the blanket reflowed Pre-Metal Dielectric (PMD) layer 46' with respect to the blanket conformal Pre-Metal Dielectric (PMD) layer 44 of greater than about 4:1. Preferably, the first etch method also has a lateral:perpendicular etch selectivity ratio for the blanket reflowed Pre-Metal Dielectric (PMD) layer 46' of from about 0.5:1 to about 1:1.

In order to provide the foregoing etch rate ratios, the first etch method is preferably an isotropic first etch method. Isotropic etch methods are known in the art of integrated circuit manufacture. Isotropic etch methods include but are not limited to wet chemical etch methods and certain Reactive Ion Etch (RIE) dry plasma etch methods. Preferably, the isotropic first etch method is a Reactive Ion Etch (RIE) dry plasma down stream etch isotropic first etch method. Preferably, the Reactive Ion Etch (RIE) dry plasma down stream etch isotropic first etch method employs nitrogen trifluoride (NF3) as a reactant gas at a reactor chamber pressure of from about 1500 to about 2100 mtorr. Other parameters under which is preferably provided the Reactive Ion Etch (RIE) dry plasma down stream etch isotropic first etch method include a radio frequency power of from about 500 to about 900 watts, a nitrogen trifluoride (NF3) flow rate of from about 250 to about 350 standard cubic centimeters per minute (sccm), a helium flow rate of from about 250 to about 300 standard cubic centimeters per minute (sccm) and a substrate temperature of from about 85 to about 95 degrees centigrade.

Figure 6:
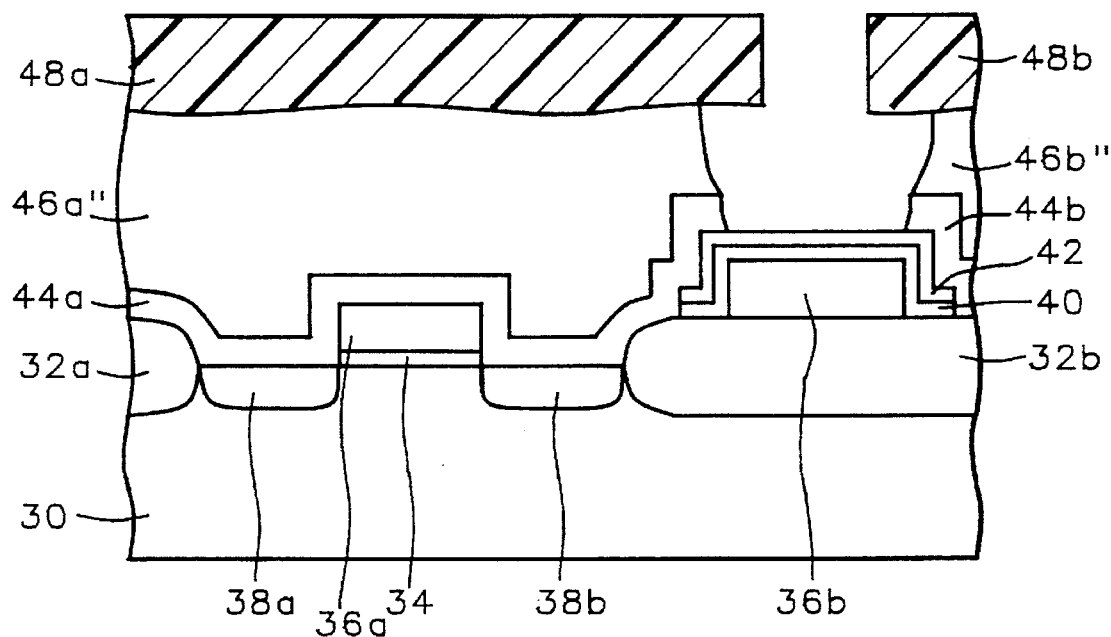

Referring now to FIG. 6, there is shown a schematic cross-sectional diagram illustrating the results of further processing of the integrated circuit whose schematic cross-sectional diagram is illustrated in FIG. 5. Shown in FIG. 6 is the continued etching of the first aperture formed through the blanket reflowed Pre-Metal Dielectric (PMD) layer 46' to form a second aperture completely through the blanket reflowed Pre-Metal Dielectric (PMD) layer 46' and the blanket conformal Pre-Metal Dielectric (PMD) layer 44. While etching completely through the blanket conformal Pre-Metal Dielectric (PMD) layer 44 to form the patterned conformal Pre-Metal Dielectric (PMD) layers 44a and 44b, the second etch method simultaneously additionally etches the patterned reflowed Pre-Metal Dielectric (PMD) layers 46a' and 46b' to form the corresponding etched patterned reflowed Pre-Metal Dielectric (PMD) layers 46a" and 46b". For the preferred embodiment of the method of the present invention, the second etch method preferably has a second perpendicular etch selectivity ratio for the patterned reflowed Pre-Metal Dielectric (PMD) layers 46a' and 46b' with respect to the blanket conformal Pre-Metal Dielectric (PMD) layer 44 of no greater than about 2:1. For the preferred embodiment of the method of the present invention, the second etch method preferably also has a lateral etch selectivity ratio for the patterned reflowed Pre-Metal Dielectric (PMD) layers 46a' and 46b' with respect to the blanket conformal Pre-Metal Dielectric (PMD) layer 44 of from about 0.5:1 to about 1:1.

Analogously with the first aperture which is preferably formed through a first etch method which is a first isotropic etch method, the second aperture is also preferably formed through a second etch method which is preferably a second isotropic etch method. Also analogously with the first isotropic etch method, the second isotropic etch method may also be chosen from the group of isotropic etch methods including but not limited to wet chemical isotropic etch methods and Reactive Ion Etch (RIE) dry plasma isotropic etch methods.

For the preferred embodiment of the method of the present invention, the second isotropic etch method is preferably a wet chemical isotropic etch method employing a Buffered Oxide Etchant (BOE). Buffered Oxide Etchants (BOEs) are known in the art of integrated circuit manufacture. Buffered Oxide Etchants (BOEs) are mixtures of 40 percent ammonium fluoride solutions and 49 percent hydrofluoric acid solutions. For the preferred embodiment of the method of the present invention, the Buffered Oxide Etchant (BOE) employed in the isotropic second etch method is preferably a 10:1 Buffered Oxide Etchant (BOE), although other concentrations of Buffered Oxide Etchant (BOE) may alternatively be employed in the wet chemical isotropic second etch method. The 10:1 Buffered Oxide Etchant (BOE) is preferably employed in forming the second aperture completely through the blanket conformal Pre-Metal Dielectric (PMD) layer 44 until there is formed the patterned conformal Pre-Metal Dielectric (PMD) layers 44a and 44b while simultaneously exposing the surface of the patterned second capacitor dielectric layer 42. Through the wet chemical isotropic second etch method there is formed through the blanket reflowed Pre-Metal Dielectric (PMD) layer 46' and the blanket conformal Pre-Metal Dielectric (PMD) layer 44 a second aperture having a uniform void-free sidewall etch profile.

Figure 7:
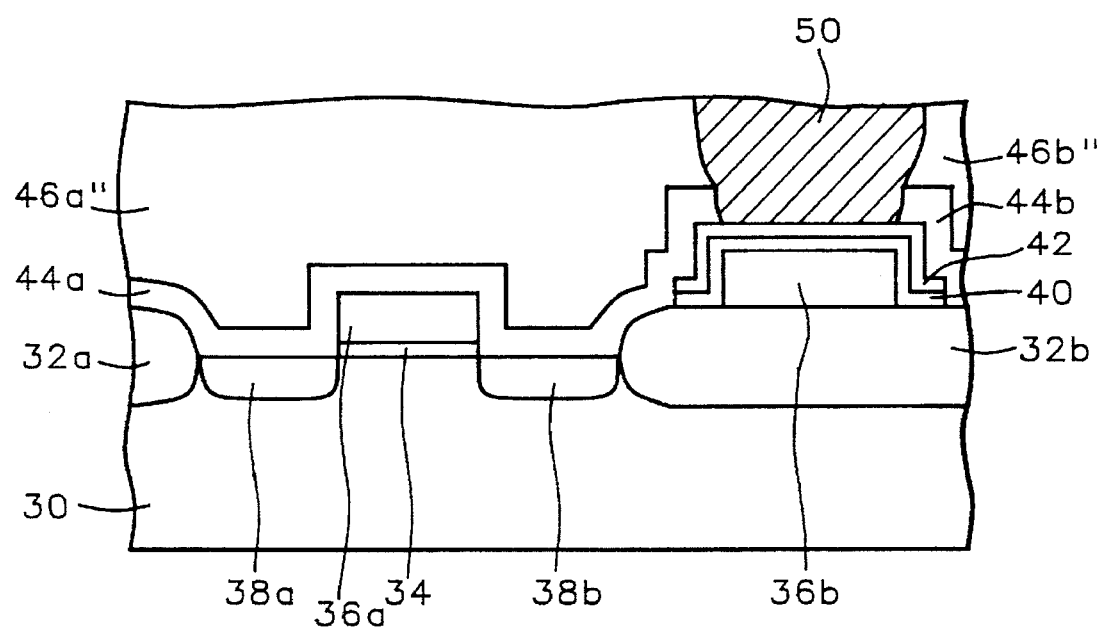

Referring now to FIG. 7, there is shown a schematic cross-sectional diagram illustrating the results of further processing of the integrated circuit whose schematic cross-sectional diagram is illustrated in FIG. 6. Shown in FIG. 7 is the presence of a second capacitor plate 50 formed into the second aperture which is defined by the etched patterned reflowed Pre-Metal Dielectric (PMD) layers 46a" and 46b", and the patterned conformal Pre-Metal Dielectric layers 44a and 44b. Methods and materials through which capacitor plates may be formed within integrated circuits are known in the art of integrated circuit manufacture. Capacitor plates may be formed within integrated circuits through methods including but not limited to Chemical Vapor Deposition (CVD) methods, Plasma Enhanced Chemical Vapor Deposition (PECVD) methods, and Physical Vapor Deposition (PVD) sputtering methods through which may be formed capacitor plates of conductive materials including but not limited to metals, metal alloys and highly doped polysilicon. For the preferred embodiment of the method of the present invention, the capacitor plate 50 is preferably formed of a composite titanium nitride barrier layer upon which is formed a tungsten layer. Preferably, the titanium nitride barrier layer is from about 600 to about 1400 angstroms thick. Preferably, the tungsten layer is formed to a thickness sufficient to reach the upper surfaces of the etched patterned reflowed Pre-Metal Dielectric (PMD) layers 46a" and 46b".

Upon forming the second capacitor plate 50 into the second aperture, there is formed through the preferred embodiment of the method of the present invention an integrated circuit which has a planar capacitor formed therein. The second capacitor plate of the planar capacitor is formed into second aperture which is etched completely through a two-layer multi-layer insulator layer, both layers of which are formed of silicon oxide with different chemical and physical properties. Within the two-layer multi-layer insulator layer, a second insulator layer is formed upon the surface of a first insulator layer. The second aperture is formed through a sequential two step etch method employing a first etch method for etching a first aperture completely through the second insulator layer, followed by a second etch method which etches a second aperture completely through the second insulator layer and the first insulator layer. Upon completing the sequential two-step etch method, there is formed a second aperture which has a uniform void-free sidewall etch profile.

What is claimed is:

1. A method for forming an aperture through a multi-layer insulator layer comprising:

forming upon a semiconductor substrate a multi-layer insulator layer, the multi-layer insulator layer having a minimum of a first insulator layer and a second insulator layer, the second insulator layer being formed upon the first insulator layer;

etching through a first etch method a first aperture completely through the second insulator layer, the first etch method having a first perpendicular etch selectivity ratio for the second insulator layer with respect to the first insulator layer of at least about 4:1, the first etch method also having a first lateral:perpendicular etch selectivity ratio for the second insulator layer of from about 0.5:1 to about 1:1, and etching through a second etch method the first aperture to form a second aperture completely through the second insulator layer and the first insulator layer, the second etch method having a second perpendicular etch selectivity ratio for the second insulator layer with respect to the first insulator layer of no greater than about 2:1, the second etch method also having a lateral etch selectivity ratio for the second insulator layer with respect to the first insulator layer of from about 0.5:1 to about 1:1.

2. The method of claim 1 wherein the second insulator layer is from about 4000 to about 6000 angstroms thick.

3. The method of claim 1 wherein the second insulator layer is a silicate glass silicon oxide insulator layer.

4. The method of claim 3 wherein the silicate glass silicon oxide insulator layer is formed from a silicate glass chosen from the group of silicate glasses consisting of Boro Silicate Glasses (BSGs), Phospho Silicate Glasses (PSGs) and Boro Phospho Silicate Glasses (BPSGs).

5. The method of claim 1 wherein the first insulator layer is from about 500 to about 1500 angstroms thick.

6. The method of claim 1 wherein the first insulator layer is a silicon oxide insulator layer formed through an Atmospheric Pressure Chemical Vapor Deposition (APCVD) method.

7. The method of claim 4 wherein the first etch method is a Reactive Ion Etch (RIE) dry plasma down stream etch isotropic first etch method employing a nitrogen trifluoride (NF3) reactant gas.

8. The method of claim 7 wherein the Reactive Ion Etch (RIE) dry plasma down stream etch isotropic first etch method employs the nitrogen trifluoride (NF3) reactant gas at a reactor chamber pressure of from about 1500 to about 2100 mtorr and a radio frequency power of from about 500 to about 900 watts.

9. The method of claim 6 wherein the second etch method is a wet chemical second isotropic etch method employing a Buffered Oxide Etchant (BOE).

10. The method of claim 9 wherein the Buffered Oxide Etchant (BOE) is a 10:1 Buffered Oxide Etchant (BOE).

11. A method for forming a capacitor plate through a multi-layer insulator layer comprising:

forming upon a semiconductor substrate a first capacitor plate, the first capacitor plate having formed thereupon at least one capacitor dielectric layer;

forming upon the capacitor dielectric layer a multi-layer insulator layer, the multi-layer insulator layer having a minimum of a first insulator layer and a second insulator layer, the second insulator layer being formed upon the first insulator layer;

etching through a first etch method a first aperture completely through the second insulator layer, the first etch method having a first perpendicular etch selectivity ratio for the second insulator layer with respect to the first insulator layer of at least about 4:1, the first etch method also having a lateral:perpendicular etch selectivity ratio for the second insulator layer of from about 0.5:1 to about 1:1;

etching through a second etch method the first aperture to form a second aperture completely through the second insulator layer and the first insulator layer to expose the capacitor dielectric layer, the second etch method having a second etch selectivity ratio for the second insulator layer with respect to the first insulator layer of no greater than about 2:1, the second etch method also having a lateral etch selectivity ratio for the second insulator layer with respect to the first insulator layer of from about 0.5:1 to about 1:1; and forming into the second aperture a second capacitor plate.

12. The method of claim 11 wherein the capacitor dielectric layer is formed of silicon nitride at a thickness of from about 100 to about 500 angstroms.

13. The method of claim 11 wherein the second insulator layer is from about 4000 to about 6000 angstroms thick.

14. The method of claim 11 wherein the second insulator layer is a silicate glass silicon oxide insulator layer.

15. The method of claim 14 wherein the silicate glass silicon oxide insulator layer is formed from a silicate glass chosen from the group of silicate glasses consisting of Boro Silicate Glasses (BSGs), Phospho Silicate Glasses (PSGs) and Boro Phospho Silicate Glasses (BPSGs).

16. The method of claim 11 wherein the first insulator layer is from about 500 to about 1500 angstroms thick.

17. The method of claim 11 wherein the first insulator layer is a silicon oxide insulator layer formed through an Atmospheric Pressure Chemical Vapor Deposition (APCVD) method.

18. The method of claim 15 wherein the first etch method is a Reactive Ion Etch (RIE) dry plasma down stream etch isotropic first etch method employing a nitrogen trifluoride (NF3) reactant gas.

19. The method of claim 18 wherein the Reactive Ion Etch (RIE) dry plasma down stream etch isotropic first etch method employs the nitrogen trifluoride (NF3) reactant gas at a reactor chamber pressure of from about 1500 to about 2100 mtorr and a radio frequency power of from about 500 to about 900 watts.

20. The method of claim 17 wherein the second etch method is a wet chemical isotropic second etch method employing a Buffered Oxide Etchant (BOE).

21. The method of claim 20 wherein the Buffered Oxide Etchant (BOE) is a 10:1 Buffered Oxide Etchant (BOE).

22. The method of claim 11 wherein the second capacitor plate is formed at least in part of tungsten metal.

* * * * *

UNITED STATES PATENT AND TRADEMARK OFFICE
CERTIFICATE OF CORRECTION

PATENT NO. : 5,652,172
DATED : July 29, 1997
INVENTOR(S) : Yung-Sung Peng, et. al.

It is certified that error appears in the above-identified patent and that said Letters Patent is hereby corrected as shown below:

Title page, item [75], inventor's name should be --Yung-Sung Peng--.

Signed and Sealed this

Twenty-third Day of December, 1997

Attest:

BRUCE LEHMAN

Attesting Officer

Commissioner of Patents and Trademarks